United States Patent
Woo et al.

(10) Patent No.: US 7,873,331 B2
(45) Date of Patent: Jan. 18, 2011

(54) SYSTEMS, METHODS, AND APPARATUSES FOR MULTI-PATH ORTHOGONAL RECURSIVE PREDISTORTION

(75) Inventors: Wangmyong Woo, Cumming, GA (US); Chang-Ho Lee, Marietta, GA (US); Jaejoon Chang, Duluth, GA (US); Haksun Kim, Daejeon (KR)

(73) Assignee: Samsung Electro-Mechanics Company, Ltd. (KR)

( * ) Notice: Subject to any disclaimer, the term of this patent is extended or adjusted under 35 U.S.C. 154(b) by 534 days.

(21) Appl. No.: 11/754,122

(22) Filed: May 25, 2007

(65) Prior Publication Data
US 2007/0290749 A1    Dec. 20, 2007

Related U.S. Application Data

(60) Provisional application No. 60/803,871, filed on Jun. 4, 2006.

(51) Int. Cl.
*H04B 1/04* (2006.01)
*H03F 1/26* (2006.01)

(52) U.S. Cl. ..................... 455/114.3; 330/149
(58) Field of Classification Search .............. 455/114.3, 455/114.2, 115.1–115.4, 108, 130, 136, 226.1–226.4, 455/293, 296, 341; 330/110, 135
See application file for complete search history.

(56) References Cited

U.S. PATENT DOCUMENTS 5,420,536 A    5/1995  Faulkner et al.
5,742,201 A    4/1998  Eisenberg et al.
6,141,390 A *  10/2000 Cova .......................... 375/297

(Continued)

FOREIGN PATENT DOCUMENTS

DE    10257436 A1    9/2003

(Continued)

OTHER PUBLICATIONS

United Kingdom Search Report for GB0710605.7, dated Sep. 27, 2007.

(Continued)

*Primary Examiner*—Duc Nguyen
*Assistant Examiner*—Ayodeji Ayotunde
(74) *Attorney, Agent, or Firm*—Sutherland Asbill & Brennan LLP

(57) ABSTRACT

System and methods are provided for multi-path orthogonal recursive predistortion. The systems and methods may include generating a first orthogonal signal and a second orthogonal signal, where the first and second signals are orthogonal components of an input signal and processing, at a first predistortion module, the first orthogonal signal and a first error correction signal to generate a first predistorted signal. The system and methods may also include processing, at a second predistortion module, the second orthogonal signal and a second error correction signal to generate a second predistorted signal, and providing the generated first and second predistorted signals to a nonlinear device, where the nonlinear device generates an output based upon the first and second predistorted signals, where the first error correction signal is determined based upon an analysis of the output and the first predistorted signal, and where the second error correction signal is determined based upon an analysis of the output and the second predistorted signal.

20 Claims, 15 Drawing Sheets

U.S. PATENT DOCUMENTS

| | | | |
|---|---|---|---|
| 6,236,267 | B1 | 5/2001 | Anzil |
| 6,295,442 | B1 | 9/2001 | Camp, Jr. et al. |
| 6,396,345 | B2 | 5/2002 | Dolman |
| 6,449,465 | B1 | 9/2002 | Gailus et al. |
| 6,642,786 | B1 | 11/2003 | Jin et al. |
| 6,794,938 | B2 | 9/2004 | Weldon |
| 6,831,905 | B1 * | 12/2004 | Lomp et al. .................. 370/335 |
| 6,914,483 | B2 | 7/2005 | Shigaki |
| 6,985,467 | B2 * | 1/2006 | Lomp et al. .................. 370/335 |
| 7,024,620 | B2 | 4/2006 | Ponce et al. |
| 7,042,286 | B2 | 5/2006 | Meade et al. |
| 7,379,715 | B2 * | 5/2008 | Udagawa et al. ............ 455/126 |
| 7,460,613 | B2 | 12/2008 | Sahlman |
| 7,532,676 | B2 * | 5/2009 | Fonseka et al. ............. 375/265 |
| 2002/0196864 | A1 | 12/2002 | Booth et al. |
| 2004/0013206 | A1 * | 1/2004 | Gamm et al. ............... 375/296 |
| 2005/0239422 | A1 | 10/2005 | Jafari et al. |
| 2006/0071711 | A1 | 4/2006 | Persson et al. |
| 2006/0178120 | A1 | 8/2006 | Puma |

FOREIGN PATENT DOCUMENTS

| | | |
|---|---|---|
| DE | 10257435 | 9/2004 |
| DE | 10257435 B3 | 9/2004 |
| EP | 1017162 A2 | 7/2000 |
| EP | 1691518 A2 | 8/2006 |
| GB | 2380880 A | 4/2003 |
| KR | 1020040016366 A | 2/2004 |
| WO | 0233844 A | 4/2002 |
| WO | 0247249 A | 6/2002 |
| WO | WO 2005015756 A1 | 2/2005 |

OTHER PUBLICATIONS

United Kingdom Search Report for GB0710609.9, dated Sep. 27, 2007.

Woo, W., A Predistortion Linearization System for High Power Amplifiers with Low Frequency Envelop Memory Effects, Microwave Symposium Digest, 2005, IEEE MTT-S International, Jun. 12-17, 2005, 4 pages.

German Office Action issued on Aug. 23, 2008 for German Patent Application No. 102007026022.

Woo, W. "A Predistortion Linearization System for High Power Amplifiers with Low Frequency Envelop Memory Effects." Microwave Symposium Digest, 2005, IEEE MTT-S International, Jun. 12-17, 2005, 4 pages.

German Office Action for German Patent Application No. 102007026022 issued on Aug. 23, 2008.

United Kingdom Search Report for GB 0710605.7, dated Sep. 27, 2007.

United Kingdom Search Report for GB 0710609.9, dated Sep. 27, 2007.

United Kingdom Search Report for GB 0710602.4, dated Sep. 27, 2007.

Notice of Allowance for U.S. Appl. No. 11/754,119 mailed Sep. 16, 2008.

Notice of Allowance for U.S. Appl. No. 11/754,119 mailed Jan. 9, 2009.

Notice of Allowance for U.S. Appl. No. 11/754,122 mailed Nov. 13, 2009.

Office Action for Korean Application No. 10-2007-005710 dated Apr. 1, 2008.

Office Action for Chinese Application No. 200710110606 dated Jun. 5, 2010.

Office Action dated Apr. 1, 2008 for Korean Application No. 10-2007-005710.

United Kingdom Search Report for GB0710602.4 dated Sep. 27, 2007.

Notice of Allowance for U.S. Appl. No. 11/754,112 mailed Sep. 2, 2010.

* cited by examiner

SYSTEMS, METHODS, AND APPARATUSES FOR MULTI-PATH ORTHOGONAL RECURSIVE PREDISTORTION

RELATED APPLICATION

This application claims priority to U.S. Provisional Ser. No. 60/803,871, entitled "Systems, Methods, and Apparatuses for Linear Polar Transmitters," filed on Jun. 4, 2006, which is incorporated by reference as if fully set forth herein.

FIELD OF THE INVENTION

The invention relates generally to linear radio signal transmitters, and more particularly to systems, methods, and apparatuses for enhancing the performance of nonlinear devices using predistortion.

BACKGROUND OF THE INVENTION

Based on the frequency spectrum of the nonlinear device output, the even-order distortion signals are found far from the fundamental signal so that they may be easily filtered out. On the other hand, the odd-order distortions are located very close to the fundamental so that it may be extremely hard to filter them out. Predistortion (PD) linearization has been proven to be an effective technique for reducing intermodulation distortion in nonlinear devices, such as power amplifiers, mixers, frequency multipliers, optical transmitters, and the like. Predistortion simply involves the creation of a distortion characteristic that is precisely complementary to the distortion characteristic of the nonlinear device, and cascading the two to ensure that the resulting system has little or no input-output distortion.

FIGS. 1A and 1B show two conventional approaches for the predistortion linearization of a PA that is a representative nonlinear device in a radio signal transmitter. In particular, FIG. 1A illustrates forward reference predistortion while FIG. 1B illustrates recursive reference predistortion.

The forward reference predistortion approach shown in FIG. 1A generally extracts the PA nonlinear characteristics by comparison of the input x(t) and the output y(t), deriving the pre-inverse function F{•} using time-consuming iterative methods to minimize the error. It is done by a digital signal processing (DSP) operating in conjunction with a look-up table. A complication of the predistortion approach of FIG. 1A is due to the phenomenon of memory effects in a PA. Memory effects are known as a serious impediment to predistortion linearization. Memory effects cause a hysteresis in the nonlinear transfer characteristics of a nonlinear device in response to past inputs. While deterministic, the net effect on the predistortion system is to create an apparent uncertainty in its response, thereby introducing some error in the model used to predistort the nonlinearity.

On the other hand, the recursive reference predistortion approach shown in FIG. 1B derives the nonlinearity by using z(t) as the reference for comparison, instead of x(t). Thus, the optimum predistortion function F{•} is given by the reciprocal of the complex gain function G{•}. The implementation of the reciprocal gain function is straightforward and can be done in analog domain so that memory effects are inherently compensated for in real time.

The two predistortion approaches of FIGS. 1A and 1B are based on the cascade predistortion on the same signal path, as shown in FIG. 2. In this case, it is intrinsically not easy to avoid cross disturbance between orthogonal signal predistorters (OPDs) since predistortion for each orthogonal signal is performed in a composite form, and there are difficulties to distinguish pure orthogonal signals and deal with predistortion on the same path.

Accordingly, there is a need in the industry for deterministic predistortion linearization that avoids cross-disturbance issues associated with conventional predistortion.

BRIEF SUMMARY OF THE INVENTION

Embodiments of the invention may provide for multi-path orthogonal recursive predistortion systems, such as an analog linear polar transmitter. This transmitter may operate in a low-power mode and achieve greater bandwidth by feeding the low-frequency even-order distortion components (i.e., the deviation from linear gain) back. Moreover, the distortion components may not be added to the input signal as feedback, but rather may be used to predistort the input signal in a multiplicative manner, according to an embodiment of the invention. For example, the low-frequency even-order distortion components may generate odd-order in-band distortion terms when they are multiplied by the fundamental signal. Thus, such architecture may be inherently more stable than conventional additive polar loop systems.

According to an embodiment of the invention, there is a method for providing a multi-path orthogonal recursive predistortion. The method may include generating a first orthogonal signal and a second orthogonal signal, where the first and second signals are orthogonal components of an input signal. The method may also include processing, at a first predistortion module, the first orthogonal signal and a first error correction signal to generate a first predistorted signal, and processing, at a second predistortion module, the second orthogonal signal and a second error correction signal to generate a second predistorted signal. The method may further include providing the generated first and second predistorted signals to a nonlinear device, where the nonlinear device generates an output based upon the first and second predistorted signals, where the first error correction signal is determined based upon an analysis of the output and the first predistorted signal, and where the second error correction signal is determined based upon an analysis of the output and the second predistorted signal.

According to another embodiment of the invention, there is a system for multi-path orthogonal recursive predistortion. The system may include a first orthogonal signal and a second orthogonal signal, where the first and second signals are orthogonal components of an input signal. The system may also include a first predistortion module that processes the first orthogonal signal and a first error correction signal to generate a first predistorted signal, a second predistortion module that processes the second orthogonal signal and a second error correction signal to generate a second predistorted signal, and a non-linear device that receives that first and second predistorted signals and generates an output based upon the first and second predistorted signals, where the first error correction signal is determined based upon an analysis of the output and the first predistorted signal, and where the second error correction signal is determined based upon an analysis of the output and the second predistorted signal.

According to another embodiment of the invention, there is a system for multi-path orthogonal recursive predistortion. The system may include a first orthogonal signal and a second orthogonal signal, where the first and second signals are orthogonal components of an input signal, means for generating a first error correction signal in order to predistort the first orthogonal signal, and means for predistorting the first orthogonal signal based upon the first error correction signal.

The system may also include means for generating a second error correction signal in order to predistort the second orthogonal signal and means for predistorting the second orthogonal signal based upon the second error correction signal. The system may further include a non-linear device that receives that first and second predistorted signals and generates an output based upon the first and second predistorted signals, where the first error correction signal is generated based upon an analysis of the output and the first predistorted signal, and where the second error correction signal is generated based upon an analysis of the output and the second predistorted signal.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

Figures 1A, 1B:
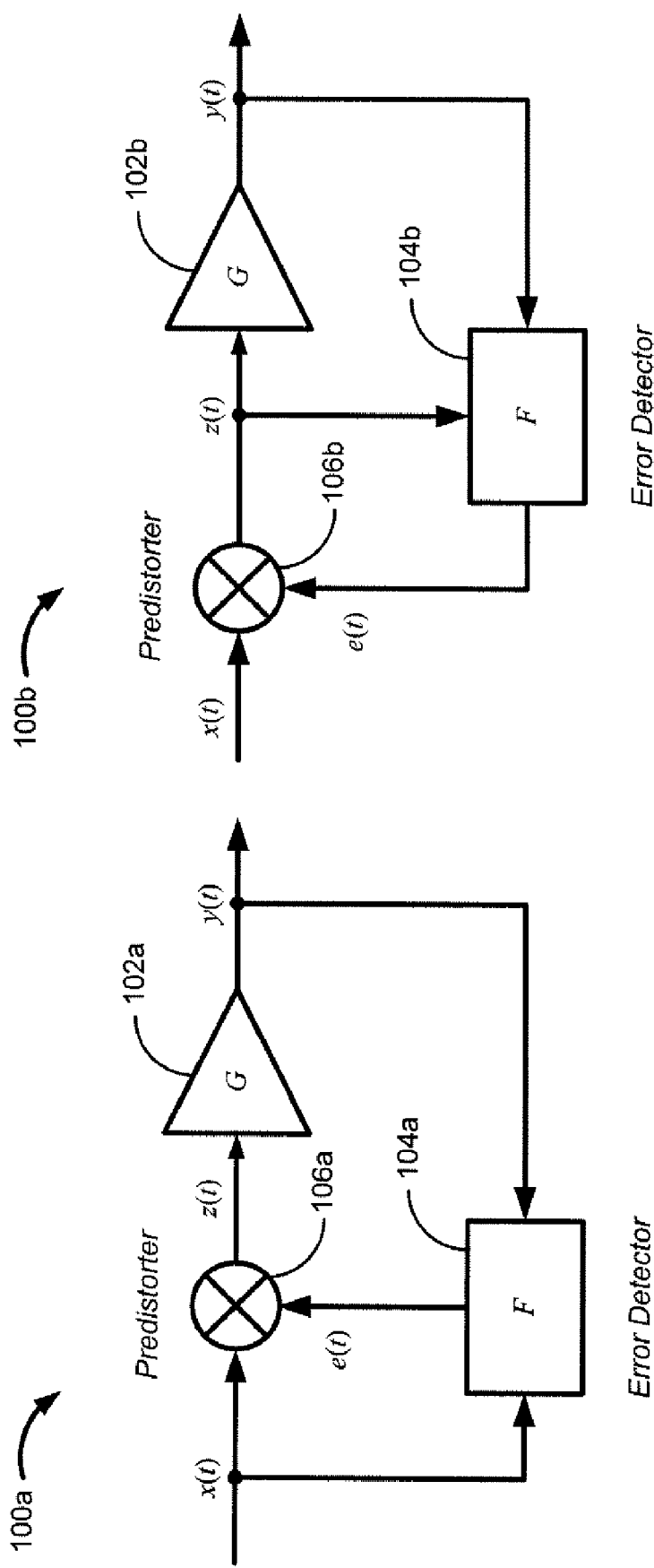
FIGS. 1A and 1B illustrate conventional predistortion architectures for forward reference predistortion and recursive reference predistortion, respectively.
Figure 2:
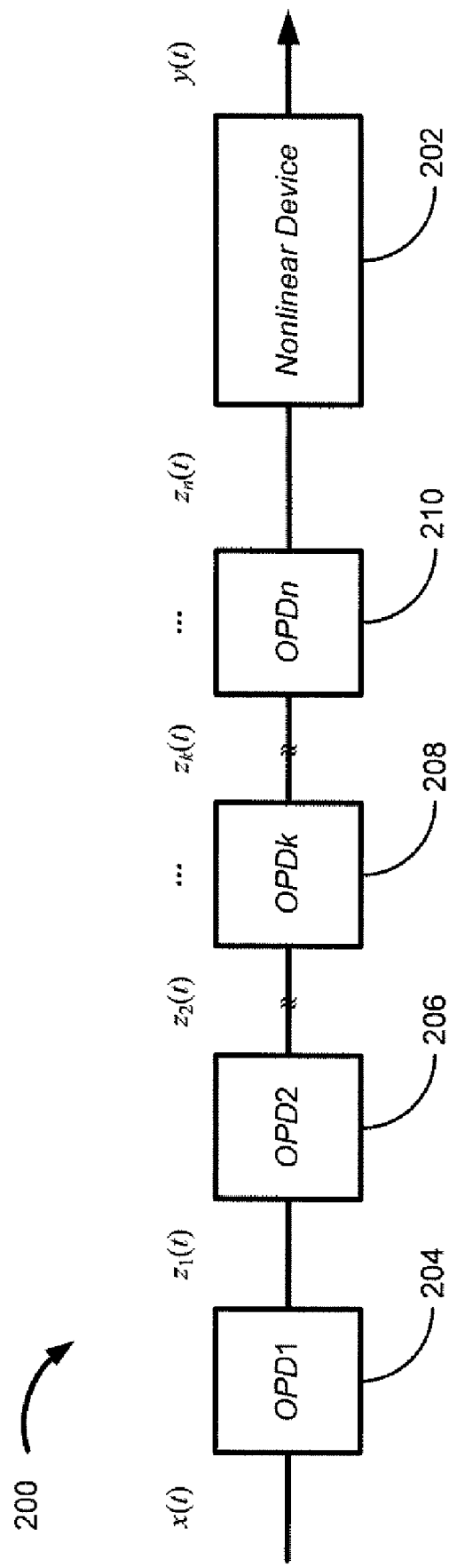
FIG. 2 illustrates a cascade predistortion system.
Figure 3:
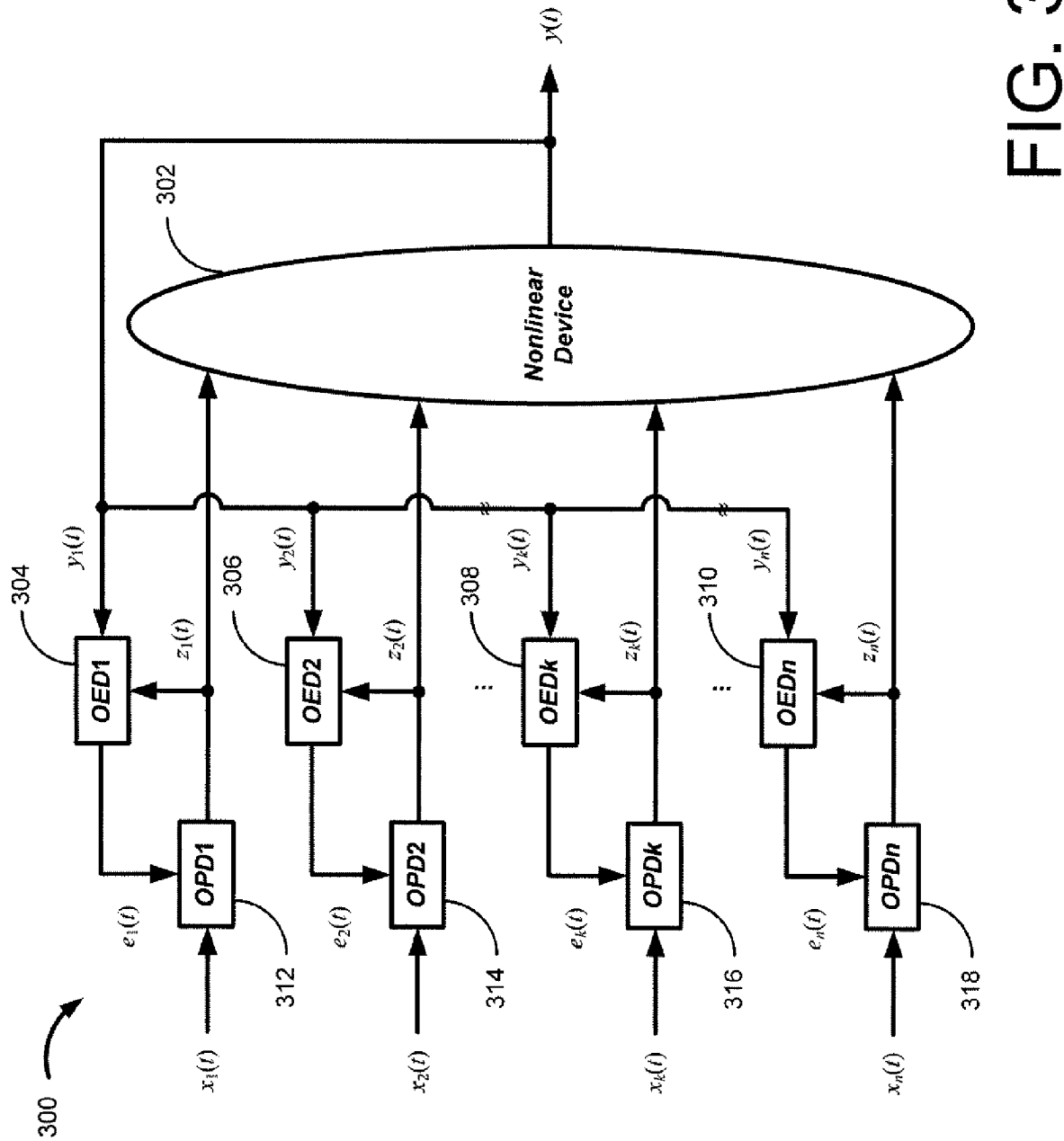

FIG. 3 provides for a multi-path orthogonal recursive predistortion system, according to an embodiment of the invention.

Figure 4A:
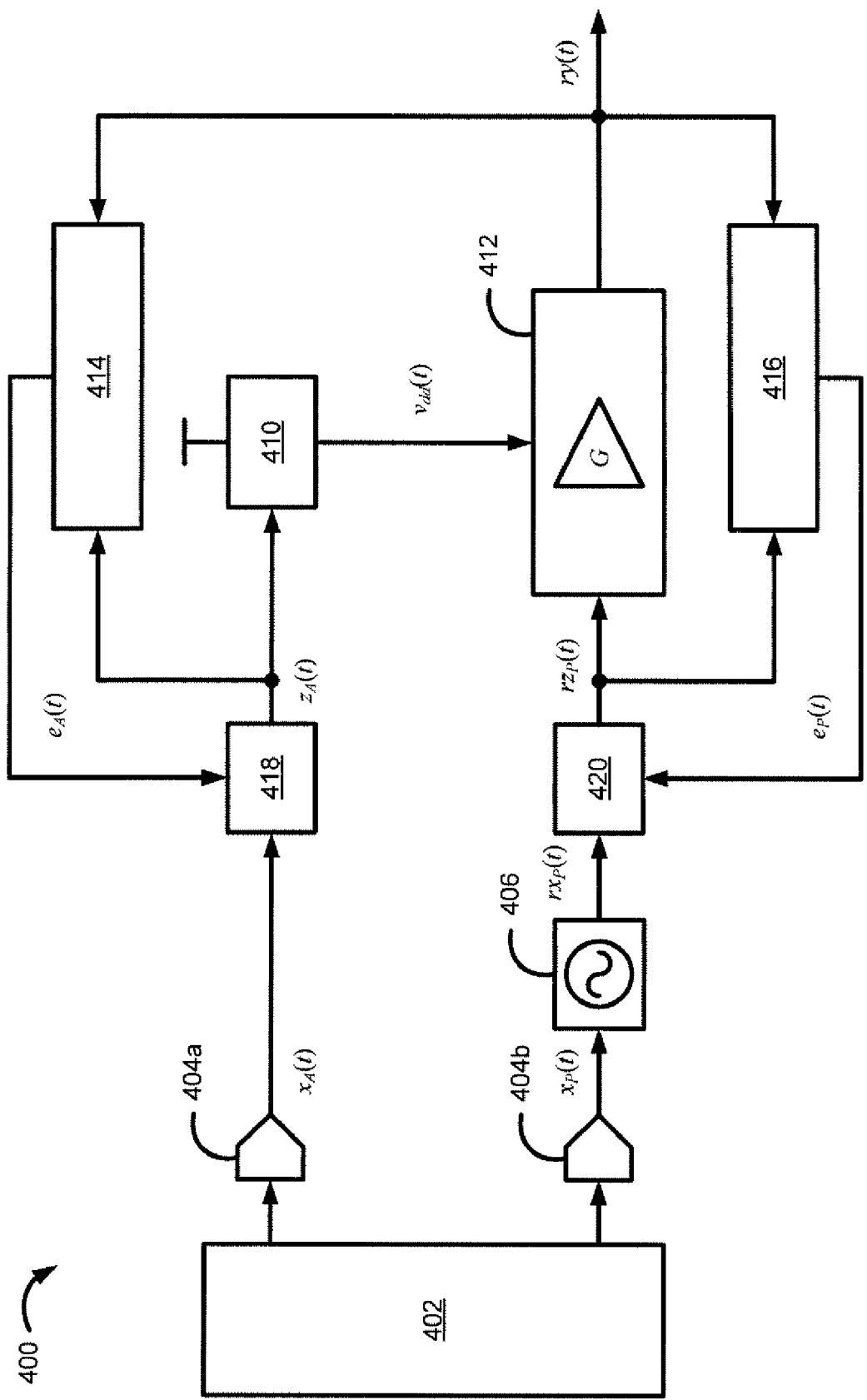
Figure 4B:
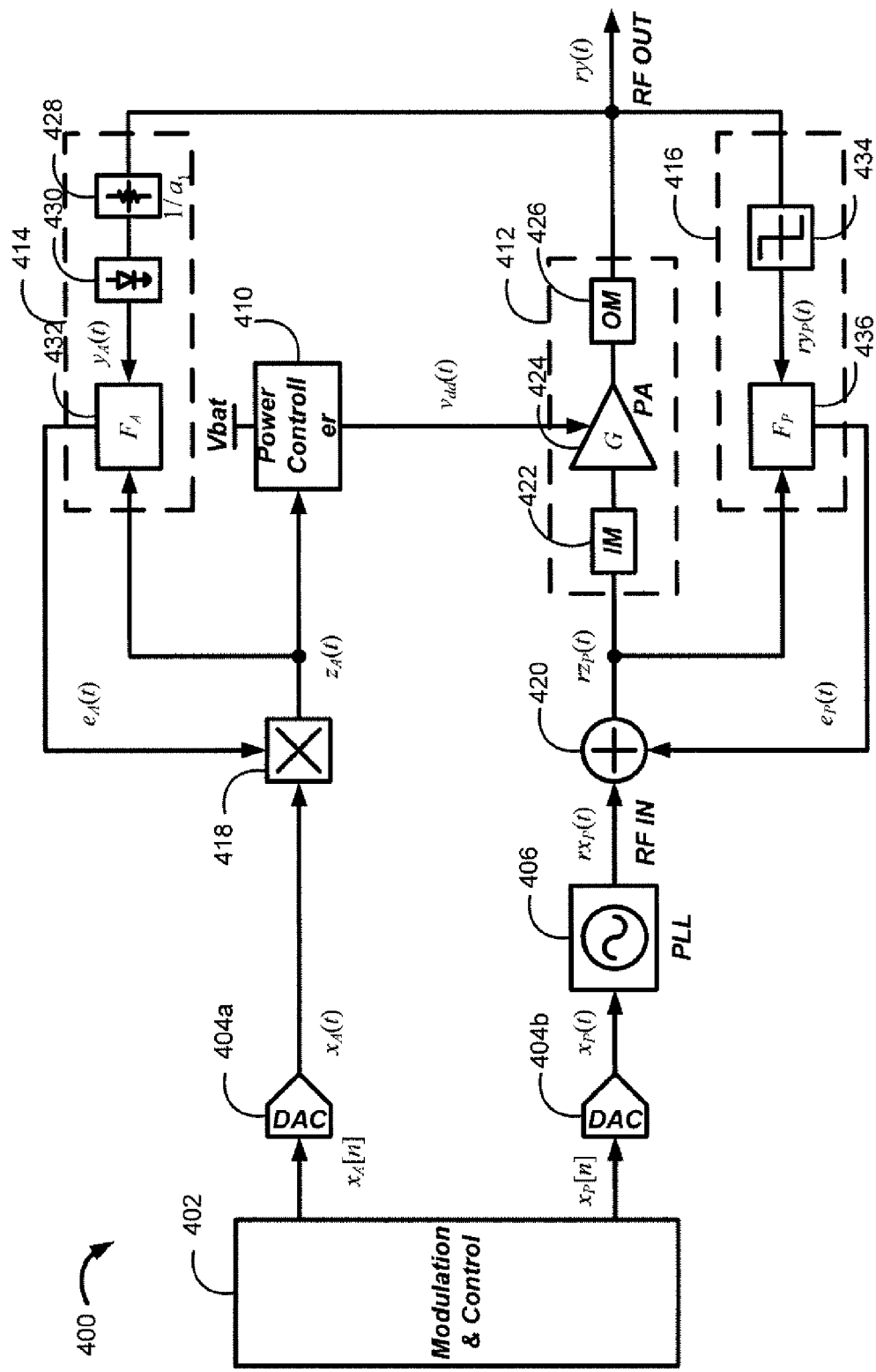

FIGS. 4A and 4B illustrate functional block diagrams of a polar transmitter system in accordance with an embodiment of the invention.

Figure 5:
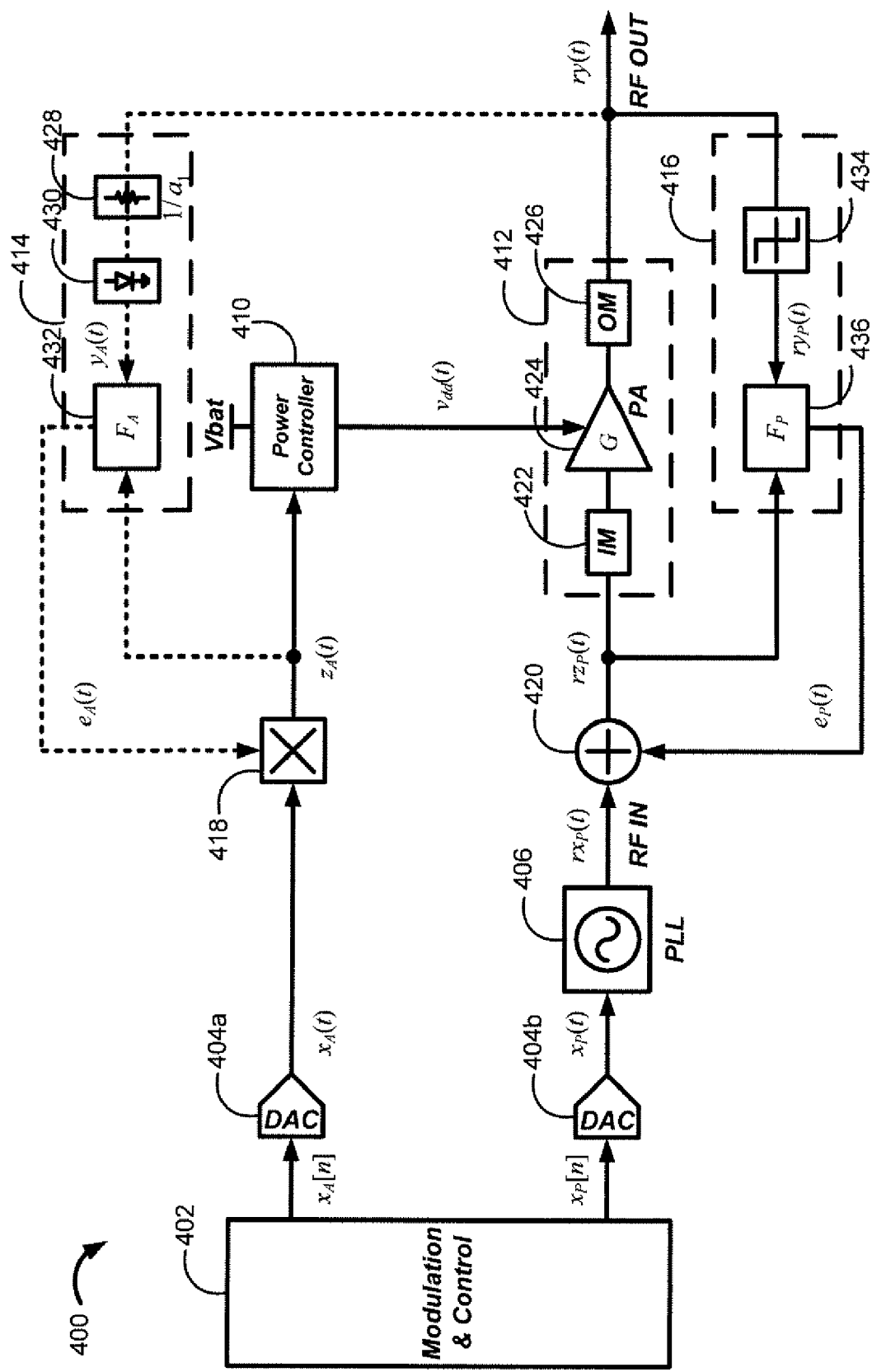

FIG. 5 illustrates an amplitude error correction loop in accordance with an embodiment of the invention.

Figure 6:
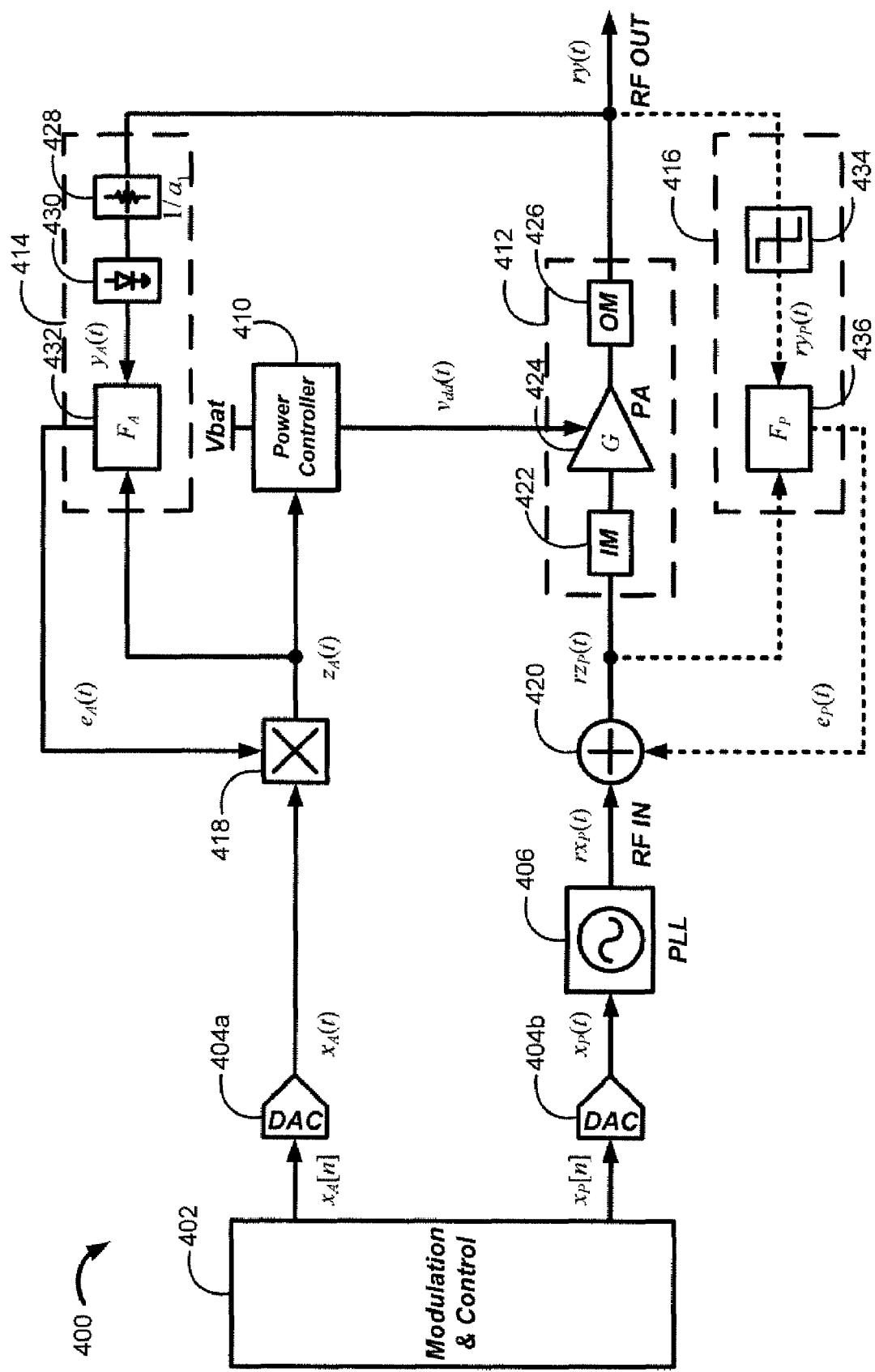

FIG. 6 illustrates the phase error correction loop in accordance with an embodiment of the invention.

Figure 7:
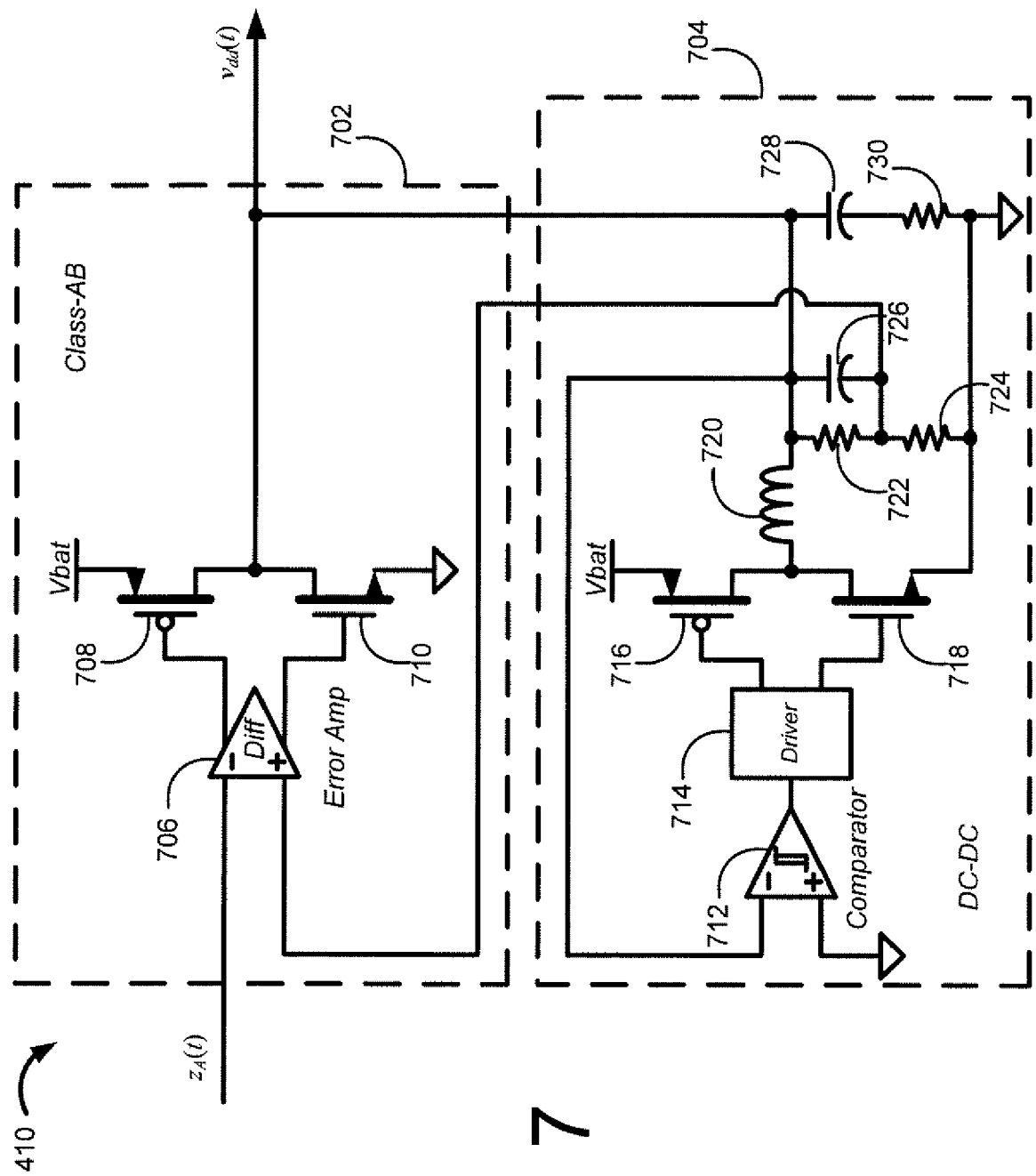

FIG. 7 illustrates the amplitude modulation scheme in accordance with an embodiment of the invention.

Figure 8:
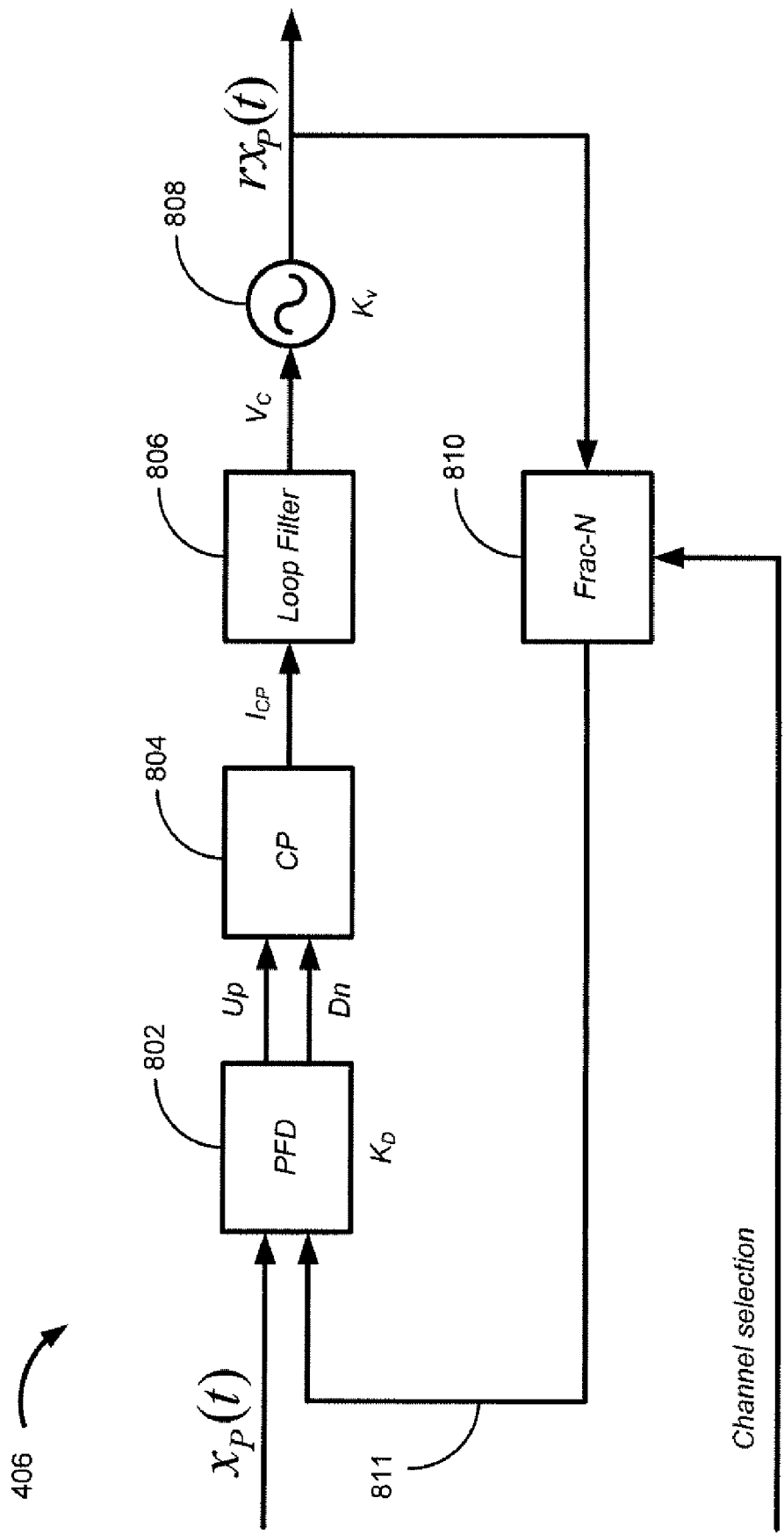

FIG. 8 illustrates the phase modulation scheme in accordance with an embodiment of the invention.

Figure 9A:
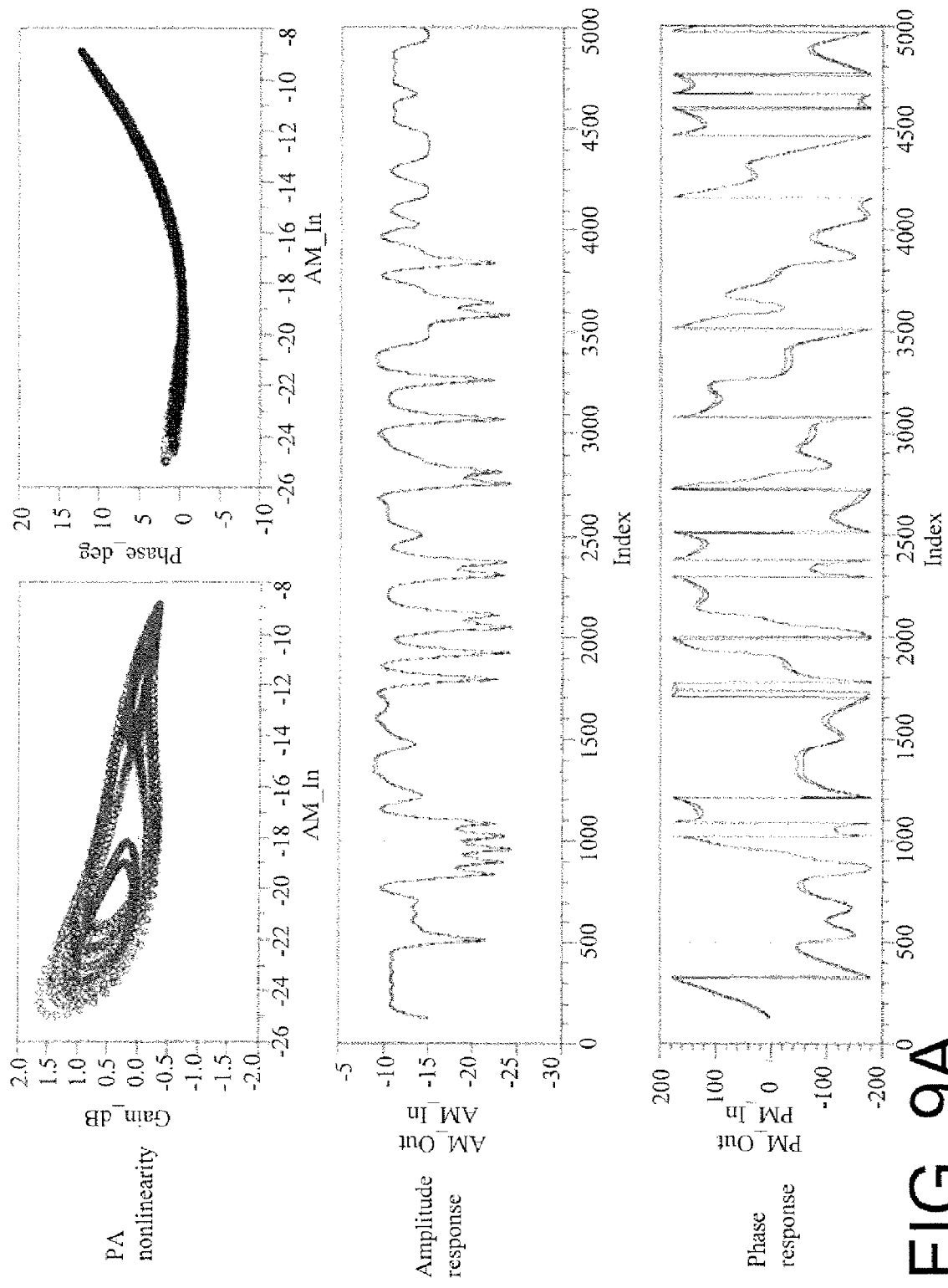
Figure 9B:
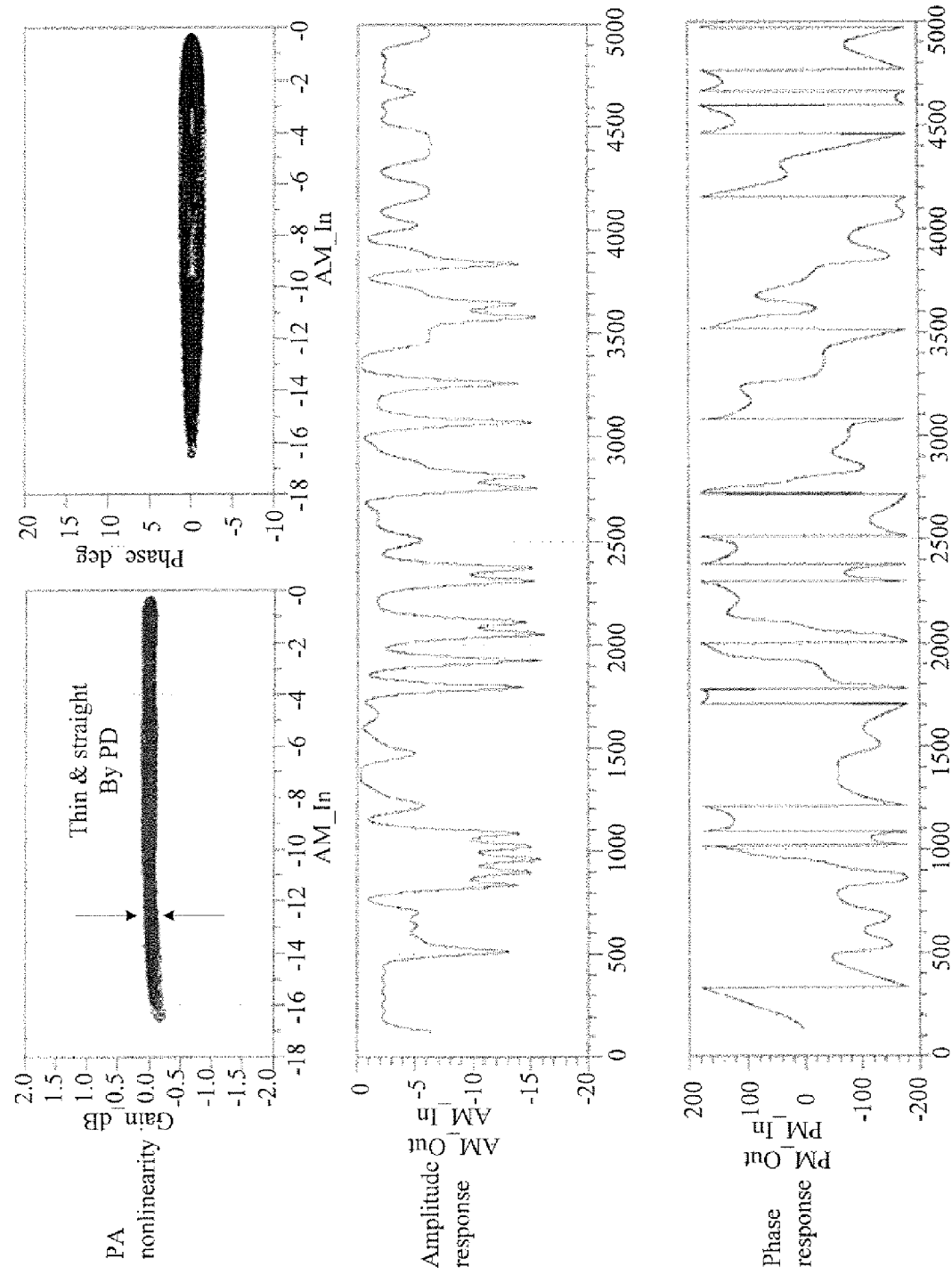

FIGS. 9A and 9B illustrates simulated power amplifier (PA) characteristics without predistortion and with predistortion, respectively, in accordance with an embodiment of the invention.

Figure 10A:
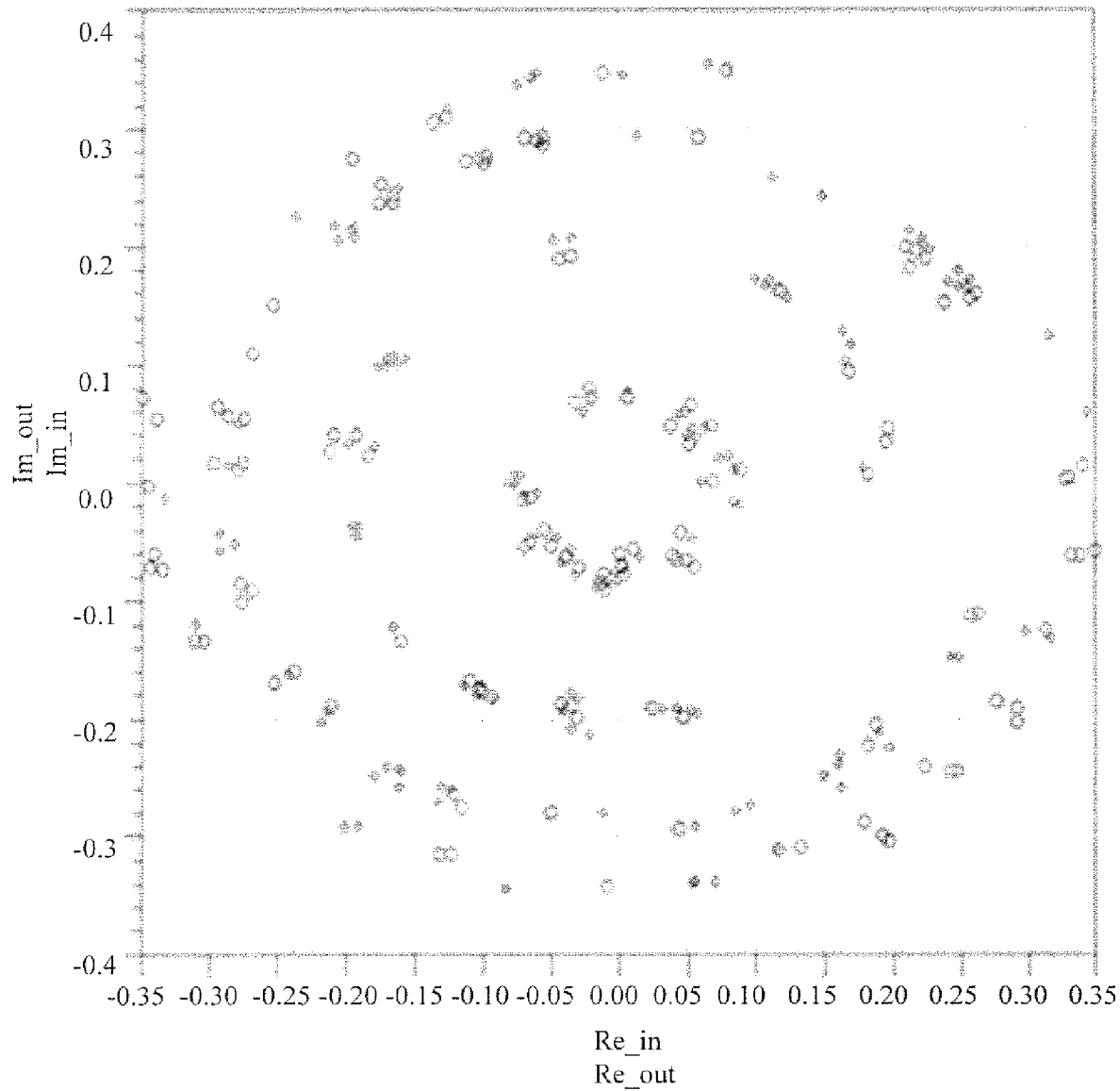
Figure 10B:
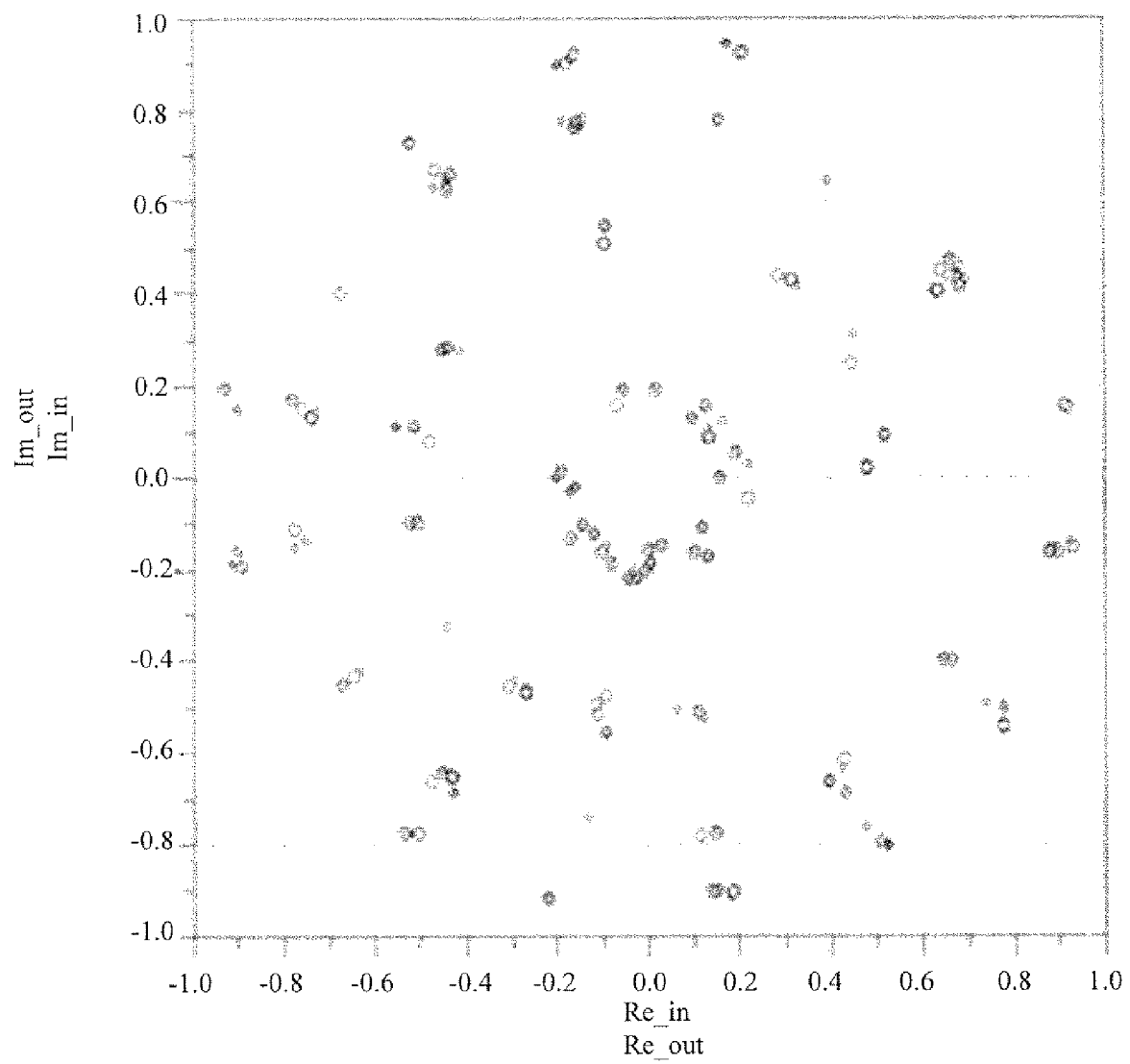

FIGS. 10A and 10B illustrates the simulated constellation results of an EDGE signal without predistortion (EVMrms: 15.6%, EVMpeak: 24.4%) and with predistortion (EVMrms: 3.4%, EVMpeak: 4.9%), in accordance with an embodiment of the invention.

Figure 11:
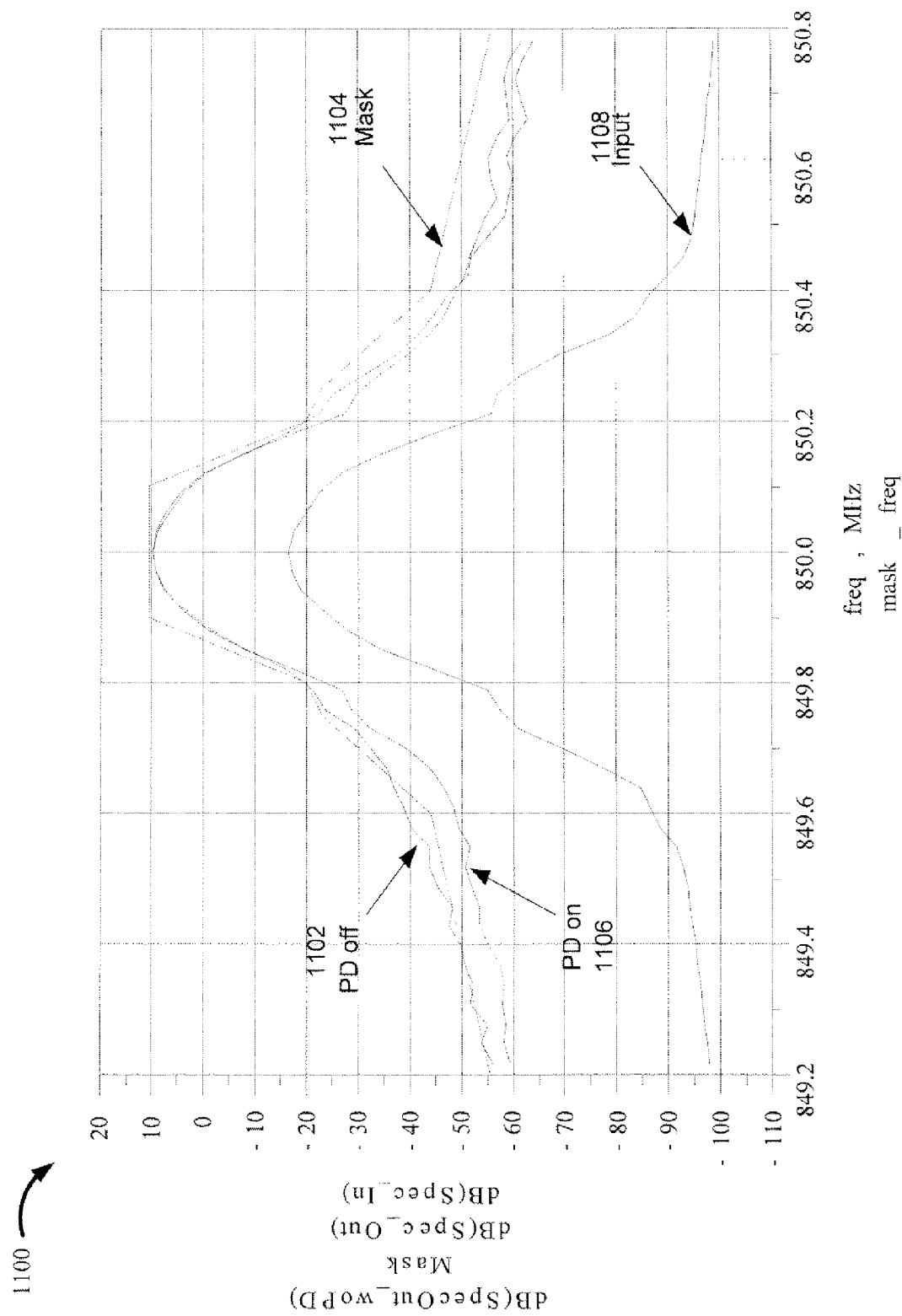

FIG. 11 illustrates the simulated spectrum results of an EDGE signal (Pout_PDoff=21 dBm and Pout_PDon=26 dBm), in accordance with an embodiment of the invention.

Figure 12:
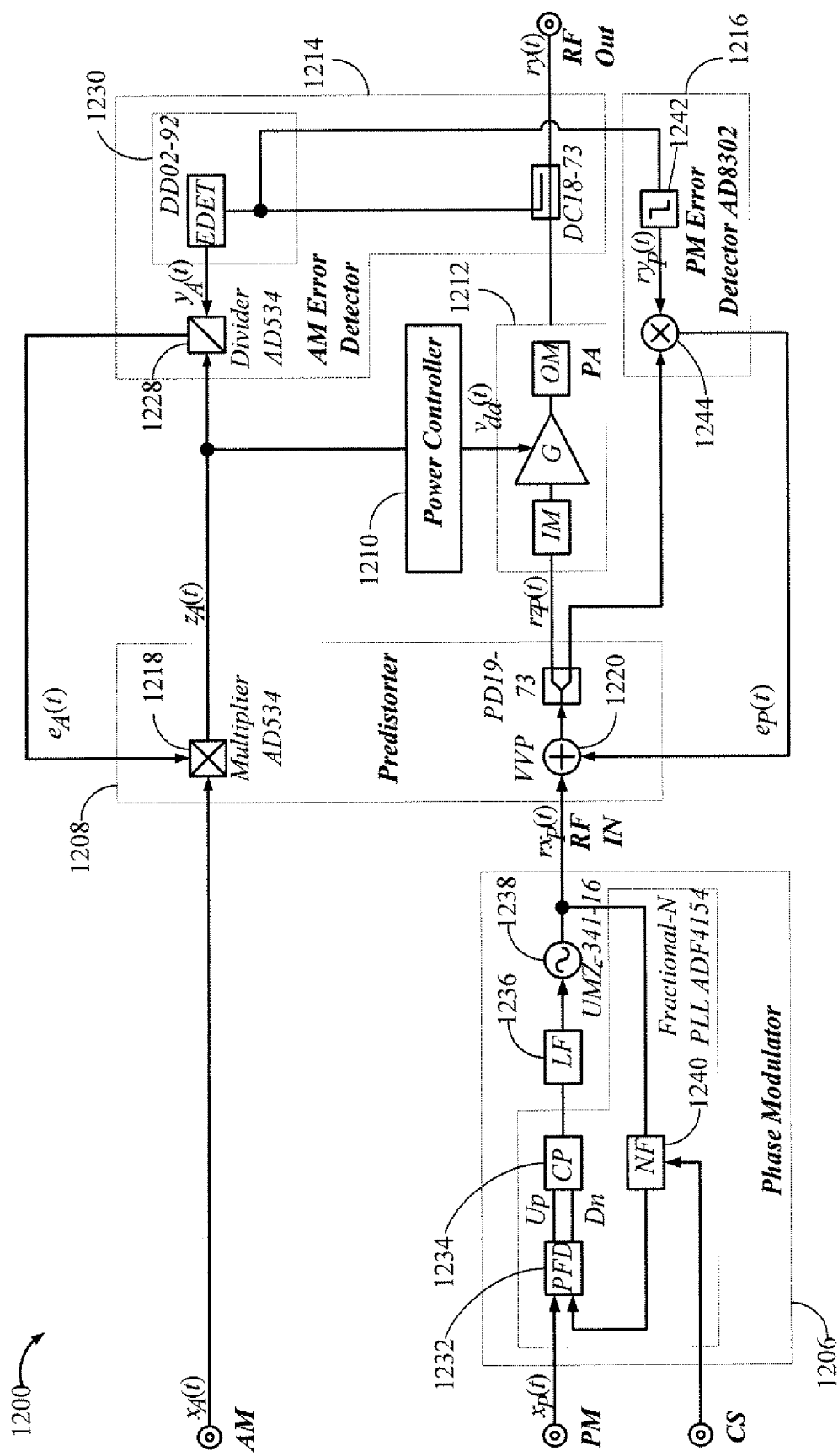

FIG. 12 illustrates a prototyping platform for an illustrative polar transmitter architecture verification, in accordance with an embodiment of the invention.

DETAILED DESCRIPTION OF THE INVENTION

The invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

In accordance with an embodiment of the invention, FIG. 3 illustrates a multi-path orthogonal recursive predistortion system 300. In FIG. 3, the system 300 may maintain deterministic predistortion linearization, but may avoid cross-disturbance issues by performing the recursive reference predistortion of orthogonal signals on different paths. As illustrated, the system 300 includes a different predistortion path for each orthogonal input signal $x_k(t)$, k=1, 2, ..., n, which may include orthogonal components of an analog input signal. Each predistortion path may result in the generation of a predistorted input signal $z_k(t)$, K=1, 2, ..., n that may be provided to a nonlinear device 302. According to an embodiment of the invention, the nonlinear device 302 may include, but is not limited to, power amplifiers, mixers, frequency multipliers, optical transmitters, and the like. Based upon the received predistorted input signals $z_k(t)$, k=1, 2, ..., n, the non-linear input device 302 may generate an output signal y(t), which is recursively fed back to each predistortion path.

The predistortion paths for the orthogonal input signals will now be described in further detail. According to an embodiment of the invention, the types of predistortion paths may differ depending on whether a polar vector or Cartesian vector of orthogonal signals is utilized. For polar vectors, there may be at least one first predistortion path associated with the amplitude component of the input signal and at least one second predistortion path associated with the phase component of the input signal. For Cartesian vectors, there may be at least one first predistortion path associated with an in-phase (I-) component of the input signal and at least one second predistortion path associated with a Quadrature-phase (Q-) component of the input signal.

Each predistortion path may include a respective orthogonal predistorter OPD and a respective orthogonal error detector OED, A variety of predistortion paths may be utilized without departing from embodiments of the invention. For example, an orthogonal predistorter OPD1 312 and an orthogonal error detector OED1 304 may be provided for predistorting an orthogonal input signal $x_1(t)$. Likewise, an orthogonal predistorter OPD2 314 and an orthogonal error detector OED2 306 may be provided for predistorting an orthogonal input signal $x_2(t)$. Similarly, an orthogonal predistorter OPDk 316 and an orthogonal error detector OEDk 308 may be provided for predistorting an orthogonal input signal $x_k(t)$. Finally, an orthogonal predistorter OPDn 318 and an orthogonal error detector OEDn 310 may be provided for predistorting an orthogonal input signal $x_n(t)$.

According to an embodiment of the invention, an orthogonal error detector OEDk, k=1, 2, ..., n may compare a respective output signal $y_k(t)$, k=1, 2, ..., n received from the nonlinear device 302 to a respective distorted input signal $z_k(t)$, k=1, 2, ..., n received from the orthogonal predistorter OPDk, k=1, 2, ..., n. Based upon this comparison, the orthogonal error detector OEDk, k=1, 2, ..., n may generate a respective orthogonal error signal $e_k(t)$, k=1, 2, ..., n. For example, on the k-th path, the orthogonal error detector OEDk 308 may derive the orthogonal error signal $e_k(t)$ by a comparison of the output $z_k(t)$ of the orthogonal predistorter OPDk 316 with the output $y_k(t)$ of the nonlinear device 302. The orthogonal error signal $e_k(t)$, k=1, 2, ..., n may then be provided to a respective orthogonal predistorter OPDk, k=1, 2, ..., n, which determines the extent to which the respective orthogonal input signal $x_k(t)$, k=1, 2, ..., n should be distorted in generating a respective distorted input signal $z_k(t)$, k=1, 2, ..., n. The distorted input signal $z_k(t)$, k=1, 2, ..., n is then provided to the nonlinear device 302. Since the system 300 in FIG. 3 uses a different path for each orthogonal signal $x_k(t)$, k=1, 2, ..., n, it may be easy to filter out any other signal and improve the overall performance of the nonlinear device, such as linearity, efficiency, and the like.

The analog orthogonal recursive predistortion linearization approach described with respect to FIG. 3 may similarly be applied to linear polar transmitters, according to an embodiment of the invention. For example, embodiments of the invention may provide for linear polar transmitters that are based upon a polar modulation technique using two respective paths for amplitude and phase. The polar modulation technique may enhance the battery life by dynamically adjusting the bias level of the power amplifier. Additionally, the analog orthogonal recursive predistortion may provide for a substantially instantaneous correction of amplitude and phase errors in a radio frequency (RF) power amplifier (PA), thereby enhancing the linear output power capability and efficiency of the PA. Additionally, embodiments of the invention may utilize even-order distortion components to predistort the input signal in a multiplicative manner, which allows for correction of any distortion that may occur within the correction loop bandwidth, including envelope memory effects.

FIG. 4A illustrates a simplified functional block diagram of an illustrative polar transmitter system 400 in accordance with an embodiment of the invention. As shown in FIG. 4A, the polar transmitter system 400 may include a baseband modulation & control module 402, digital-to-analog converters (DACs) 404*a* and 404*b*, a phase modulator module 406, an amplitude predistortion module 418, a phase predistortion module 420, an amplifier power control (APC) module 410, a power amplifier module 412, an amplitude modulation error detection module 414, and a phase modulation error detection module 416. During operation of the polar transmitter system 400, the baseband modulation & control module 402 may generate two orthogonal input signals—one representing the amplitude and one representing the phase of the input signal, which are respectively provided to the digital-to-analog converters (DACs) 404*a* and 404*b*, respectively. The two baseband digital input signals may be synchronized according to an embodiment of the invention. It will be appreciated that while the two orthogonal input signals are associated with amplitude and phase, respectively, other embodiments of the invention may utilize I- and Q-components for a Cartesian system. Furthermore, other orthogonal input signals may be utilized as well without departing from embodiments of the invention.

The analog amplitude signal $x_A(t)$ at the output of DAC 404*a* may be provided to the amplitude predistortion module 418 as the input amplitude signal. Likewise, the analog phase signal $x_P(t)$ at the output of DAC 404*b* is provided to the phase modulation module 406 in order to upconvert the analog phase modulation signal $x_P(t)$ from a baseband signal to a RF signal $rx_P(t)$. The resulting input amplitude signal $rx_P(t)$ may then be provided to the phase predistortion module 420.

The amplitude predistortion module 418 and the phase predistortion module 420 will now be discussed with respect to FIG. 4B, which provides a more detailed functional block diagram of the polar transmitter system 400 of FIG. 4A. As illustrated, the amplitude predistortion module 418 may be a multiplier and the phase predistortion module 420 may be a phase adder. According to an embodiment of the invention, the amplitude multiplier for amplitude predistortion may be a Gilbert cell voltage multiplier, while the phase adder for phase predistortion may be a voltage-controlled variable phase (VVP) shifter.

Still referring to FIG. 4B, the amplitude modulation error detection module 414 may include an attenuator 428 with the attenuation of $1/a_1$, an envelope detector (EDET) 430, and an amplitude predistortion function 432. The phase modulation error detection module 416 may include an amplitude limiter 434 and a phase predistortion function 436. The power amplifier module 412 includes a power amplifier 424 having transfer function $G\{\cdot\}$. In addition, the power amplifier module 412 may additionally include one or more input matching (IM) circuits 422 and output matching (OM) circuits 426. The IM circuit 422 may provide for impedance matching at the input of the power amplifier 424 while the OM circuit 426 may provide for impedance matching at the output of the power amplifier 424.

As will also be described in further detail below, the amplitude predistortion module 418 and the phase predistortion module 420 may be operative to predistort the baseband amplitude signal $x_A(t)$ and the phase-modulated RF signal $rx_P(t)$, respectively. In particular, the amplitude signal input $x_A(t)$ may be predistorted by an inverse amplitude error signal $e_A(t)$ from the amplitude modulation error detection module 414, producing an amplitude-predistorted signal $z_A(t)$. As a result, the output $z_A(t)$ may contain the fundamental term of the input $x_A(t)$ as well as the inverse, odd-order intermodulation distortion (IMD) terms of the output $y_A(t)$, such as third-order IMD, fifth-order IMD, and the like. The inverse amplitude distortion terms may be used in the power amplifier module 412 to compensate for the amplitude distortions of the PA output $ry(t)$.

To produce the inverse amplitude error signal $e_A(t)$, the amplitude modulation error detection module 414, and in particular the amplitude predistortion function 432, generally performs a comparison of the output $z_A(t)$ of the predistortion module 418 with the envelope-detected output $y_A(t)$ of the power amplifier module 412. For example, the comparison of the output $z_A(t)$ of the amplitude predistortion module 418 with the envelope-detected output $y_A(t)$ of the PA output $ry(t)$ through a diode envelope detector 430 may be performed by a voltage divider. By dividing the signal $z_A(t)$ by the signal $y_A(t)$, the odd-order distortion terms, which are located near to the fundamental term, are order-down converted to the lower odd-order distortion terms. The inverse amplitude error signal $e_A(t)$ may include the inverse amplitude gain of the power amplifier module 412. The inverse amplitude error signal $e_A(t)$ may also include low-frequency, even-order intermodulation distortion terms, alleviating the required bandwidth of components operating in the amplitude error correction loop.

Likewise, the phase-modulated RF signal input $rx_P(t)$ may be predistorted by an inverse phase error signal $e_P(t)$ from the phase modulation error detection module 416, producing a phase-predistorted RF signal $rz_P(t)$. As a result, the output $rz_P(t)$ may contain the fundamental term of the input $rx_P(t)$ as well as the inverse odd-order intermodulation distortion (IMD) terms of the output $ry_P(t)$, such as third-order IMD, fifth-order IMD, and the like. The inverse phase distortion terms may be used in the power amplifier module 412 to compensate for the phase distortions of the PA output $ry(t)$.

To produce the inverse phase error signal $e_P(t)$, the phase modulation error detection module 416, and in particular, the phase predistortion function 436, generally performs a comparison of the output $rz_P(t)$ of the predistortion module 420 with the amplitude-limited output $ry_P(t)$ of the power amplifier module 412. For example, the comparison of the output $rz_P(t)$ of the phase predistortion module 420 with the amplitude-limited output $ry_P(t)$ of the PA output $ry(t)$ through a amplitude limiter 434 may be performed by a Gilbert-cell voltage multiplier. When relatively small amplitude signals are applied to the input ports of the Gilbert-cell voltage multiplier, it may behave as an analog multiplier. If the phase error of the inputs is in the vicinity of 90°, the average value of the output may be linearly proportional to the phase error. The inverse amplitude error signal $e_P(t)$ may include the inverse phase deviation of the power amplifier module 412.

The inverse phase error signal $e_P(t)$ may also include low-frequency, even-order intermodulation distortion terms, thereby alleviating the required bandwidth of components operating in the phase error correction loop.

In FIG. 4B, the polar transmitter system 400 provides a linearization scheme to look at any changes of the PA output ry(t) and almost instantaneously predistort the input signal $x_A(t)$ and $rx_P(t)$. More specifically, the predistortion mechanism in accordance with an embodiment of the invention may utilize the predistorted signal toward the PA 424 as the reference for recursive predistortion so that the outputs $e_A(t)$ and $e_P(t)$ of modulation error detection modules 414, 416 may be simply the reciprocal of the PA 424 transfer function $G\{\bullet\}$. Accordingly, the calculation of the predistortion function (e.g., $F_A$ 432, $F_P$ 436) may be performed by analog components.

If the amplitude modulation (AM) and phase modulation (PM) paths are fully synchronized, then the PA 424 input signal rz(t), which comes from the multiplication of the transmitter input signal rx(t) with the inverse PA distortion signal e(t), may be defined as follows:

$$rz(t) = z_A(t) \angle rz_P(t) \quad (1)$$
$$= \{x_A(t) \cdot e_A(t)\} \angle \{rx_P(t) + e_P(t)\}$$
$$= rx(t) \cdot e(t),$$

where $x_A(t)$ and $rx_P(t)$ are the baseband amplitude input and the phase-modulated RF input, respectively. Likewise, $e_A(t)$ and $e_P(t)$ are the outputs of the predistortion function $F_A\{\bullet\}$ 432 for amplitude and $F_P\{\bullet\}$ 436 for phase, respectively.

As the system 400 of FIG. 4B may be based on polar modulation, the amplitude signal $e_A(t)$ and phase signal $e_P(t)$ of the inverse PA distortion signal e(t) may be calculated separately via the amplitude function $F_A\{\bullet\}$ 432 and phase error predistortion function $F_P\{\bullet\}$ 436, respectively. When up to third-order terms (k=2) in PA nonlinear components and a complex-form analysis are considered for simplicity, the output y(t) of the PA 424 may be described as follows:

$$ry(t) = rz(t) \cdot G\{z_A(t)\} \quad (2)$$
$$= [rx(t) \cdot e(t)] \cdot G\{z_A(t)\},$$

$$G\{z_A(t)\} = \sum_{k=1}^{K} a_{2k-1} \cdot z_A^{2(k-1)}(t), \quad (3)$$

$$e(t) = F\{z_A(t)\} = a_1 \cdot G^{-1}\{z_A(t)\}, \quad (4)$$

where $G\{\bullet\}$ is the PA 424 odd-order transfer function, $F\{\cap\}$ is the predistortion function comprised of $F_A$ 432 and $F_P$ 436, and $a_k$ is the k-th complex coefficient of the PA 424 transfer function. As a result obtained from equations (1) to (4) above, a linearly amplified RF signal $a_1 \cdot rx(t)$ can simply be produced with this architecture, according to an embodiment of the invention.

Amplitude Error Correction. The amplitude error correction loop, which includes the amplitude modulation error detection module 414, will be described with reference to FIG. 5. The inverse amplitude error signal $e_A(t)$ may be obtained by the comparison of the output $z_A(t)$ of an amplitude predistortion module 418 (e.g., a multiplier) and the output $y_A(t)$ of a diode-based envelope detector (EDET) 430.

Once the amplitude error signal $e_A(t)$ is obtained, it may be multiplied with the input amplitude signal $x_A(t)$ to produce the amplitude-predistorted signal $z_A(t)$. This process may be performed recursively.

Phase Error Correction. FIG. 6 illustrates the phase error correction loop, which includes the phase modulation error detection module 416. As in the amplitude correction loop, the inverse phase error signal $e_P(t)$ is obtained from the comparison of the output $rz_P(t)$ of a phase predistortion module 420 (e.g., phase adder) and the amplitude-limited output $ry_P(t)$ of an amplitude limiter 434. Once the phase error signal $e_P(t)$ is obtained, it is added to the phase-modulated RF input signal $rx_P(t)$ to produce the phase-predistorted signal $rz_P(t)$. Since the output $rx_P(t)$ of a phase-locked loop (PLL), which is used as the phase modulation module 406, is at radio frequency, the phase predistortion module 420 may be implemented by a reflection-type voltage-controlled variable phase shifter (VVP), according to an embodiment of the invention.

Amplitude Modulation. In time-division multiple access (TDMA) communication systems such as GSM/EDGE, the power control of a PA output has to meet the time mask specification, while preserving the efficiency of the power supply. This power control may be performed by using a linear regulator, switching regulator, or combined structure. Unlike the GSM system, a polar EDGE system in accordance with an embodiment of the invention may require the tracking of RF envelope signals. Tracking the envelope signal may require a much wider operation bandwidth. FIG. 7 shows an illustrative example of a combined PA controller 410 scheme that may be employed for power efficiency and wideband operation. As shown in FIG. 7, the DC-DC converter 704 may provide the DC and low frequency load current while the Class-AB linear amplifier 702 may provide the high frequency load current, maintaining the tracking loop closed. The DC-DC converter 704 may be controlled by the output current of the Class-AB amplifier 702. The hysteric current controller of the DC-DC converter 704 may attempt to minimize the output current of the Class-AB amplifier 702, to maximize the overall efficiency. The output capacitance 728 of the architecture may be low to maintain the high bandwidth of the Class-AB amplifier 702 loop. Moreover, the ripple current of the DC-DC converter 704 may be principally absorbed by the Class-AB linear amplifier 702 operating in conjunction with a feedback loop. Thus, this linear-assisted architecture may be expected to have a high envelope tracking bandwidth, preserving a good linearity and efficiency.

Phase Modulation. FIG. 8 illustrates a phase modulator module 406 that may be utilized in accordance with an embodiment of the invention. Referring to FIG. 8, a phase-modulated intermediate frequency (IF) signal $x_P(t)$ is applied to the phase-frequency detector (PFD) 802 for both phase-locking reference and phase modulation. The PFD 802 compares the IF signal $x_P(t)$ to the feedback signal 811 to generate voltage pulses. In particular, the voltage pulse (e.g., UP/DOWN) directs the charge pump (CP) 804 to supply charge amounts in proportion to the phase error detected. Generally, these pulses are small and substantially the same duration such that the CP 804 produces equal-charge positive and negative pulses when the phase is perfectly matched. The output $I_{CP}$ of the CP 804 is provided to a filter 806 (e.g., a loop filter), and the resultant signal Vc is provided to an oscillator 808 to generate a phase-corrected signal $rx_P(t)$.

In FIG. 8, with an IF reference signal $x_P(t)$ carrying the phase information, a large portion of components on the feedback path may be avoided, resulting in low phase noise. Moreover, by using a fractional-N divider 810 for downconversion, the phase modulator module 406 needs only a phase-locked loop (PLL), as provided by PFD 802, CP 804, and divider 810. According to an embodiment of the invention, the phase modulator module 406 may not require one or more of a downconversion mixer, local oscillator (LO), or filter.

Simulation Results. The time-domain signal test shown in FIGS. 9A and 9B illustrate the improved performance of a PA 424 in accordance with an embodiment of the invention. In particular, FIG. 9A illustrates the results obtained without the use of the linearizer, while FIG. 9B shows the results with the use of the linearizer implemented using the predistortion provided in accordance with an embodiment of the invention. As shown in FIG. 9B, the PA 424 output with the linearizer turned on tracks the original input signal well, and the nonlinearity in the amplitude and phase is well linearized, even in the situation with memory effects that display scattered PA 424 characteristics over power.

Error vector magnitude (EVM) measurement provides a means of characterizing the magnitude and phase variations introduced by the PA nonlinear behavior over a wide dynamic range. In comparison of results shown in FIGS. 10A and 10B, the EVM simulation results exhibits the improvements of 12.2% in root-mean-square (RMS) and 19.5% in peak by use of the predistortion provided by embodiments of the invention. FIG. 11 shows the spectrum results in which without predistortion, the spectrum 1102 violates the regulation mask 1104. On the other hand, in FIG. 11 the spectrum 1106 from the simulation with the predistortion turned on is well below the mask 1104 over the range displayed.

Illustrative Implementation. FIG. 12 shows an illustrative system 1200 implemented in accordance with an embodiment of the invention. The system 1200 may include a phase modulator 1206 for the upconversion of a phase modulation signal to an RF signal, a predistorter (PD) 1208 for the predistortion of the input signal toward a PA 1212, an amplifier power controller (APC) 1210 for the power regulation and dynamic power control, an amplitude modulation error detector 1214 for the AM/AM distortion extraction, and a phase modulation error detector 1216 for the AM/PM distortion extraction. As illustrated, the phase modulator 1206 includes an analog phase-locked loop (PLL). In particular, the PLL is formed of a phase frequency detector (PFD) 1232, a charge pump (CP) 1234, a loop filter 1236, a voltage-controlled oscillator (VCO) 1238, and a frequency divider 1240 (e.g., divide by N) placed in the feedback loop, as illustrated in FIG. 12. The PD 1208 includes a multiplier 1218 for multiplying the amplitude input signal $x_A(t)$ with the amplitude error signal $e_A(t)$, In addition, the PD 1208 also includes a phase adder 1220 for adding a phase error signal $e_P(t)$ to the phase-modulated RF input signal $rx_P(t)$. The Amplitude Modulation (AM) error detector 1214 may include an envelope detector 1230 for determining amplitude $y_A(t)$ of the output $ry(t)$ of the PA 1212. In addition, the AM error detector includes a divider 1228 for calculating an inverse amplitude error signal $e_A(t)$ using the amplitude $y_A(t)$ of the output $ry(t)$ and the amplitude-predistorted output $z_A(t)$ of the PD 1208. The phase modulation (PM) error detector 1216 includes an amplitude limiter 1242 and a multiplier 1244 for determining an inverse phase error signal $e_P(t)$ using the amplitude-limited output $ry_P(t)$ of the output $ry(t)$ and the phase-predistorted output $rx_P(t)$ of the PD 1208. One of ordinary skill in the art will recognize that the system 1200 can be applied to a variety of power amplifiers 1212, including linear PAs and switching PAs.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A method for providing a multi-path orthogonal recursive predistortion, comprising:
generating a first orthogonal signal and a second orthogonal signal, wherein the first and second signals are orthogonal components of an input signal;
combining, in analog by a first predistortion module, the first orthogonal signal with a first error correction signal to generate a first predistorted signal;
combining, in analog by a second predistortion module, the second orthogonal signal with a second error correction signal to generate a second predistorted signal; and
providing the generated first and second predistorted signals to a nonlinear device, wherein the nonlinear device generates an output based upon the first and second predistorted signals, wherein the first error correction signal is determined based upon an analysis of the output and the first predistorted signal, and wherein the second error correction signal is determined based upon an analysis of the output and the second predistorted signal.

2. The method of claim 1, wherein the nonlinear device comprises one of (i) a power amplifier, (ii) a mixer, (iii) a frequency multiplier, and (iv) a transmitter.

3. The method of claim 1, wherein the first orthogonal signal includes an amplitude component of the input signal, and the second orthogonal signal includes a phase component of the input signal.

4. The method of claim 3, wherein the first error signal is an inverse amplitude error signal and the second error signal is an inverse phase error signal.

5. The method of claim 1, wherein the input signal is a Cartesian vector signal, and the first orthogonal signal includes an in-phase component of the Cartesian vector signal and the second orthogonal signal includes a Quadrature-phase component of the Cartesian vector signal.

6. The method of claim 1, wherein the first predistortion module is a multiplier that multiplies the first orthogonal signal with the first error correction signal, and wherein the second predistortion module is a phase adder that adds the second orthogonal signal with the second error correction signal.

7. The method of claim 1, wherein at least one of the first error signal and the second error signal includes even-order distortion terms.

8. The method of claim 1, wherein the first error correction signal is determined based upon a comparison of the first predistorted signal to the output that is processed by an envelope detector, and wherein the second error correction signal is determined based upon a comparison of the second predistorted signal to the output that is processed by an amplitude limiter.

9. The method of claim 8, wherein the first error correction signal is determined by dividing the first predistorted signal by the output that is processed by the envelope detector, and wherein the second error correction signal is determined by multiplying the second predistorted signal by the output that is processed by an amplitude limiter.

10. A system for multi-path orthogonal recursive predistortion, comprising:
a first predistortion module that combines in analog a first orthogonal signal with a first error correction signal to generate a first predistorted signal;
a second predistortion module that combines in analog a second orthogonal signal with a second error correction signal to generate a second predistorted signal, wherein the first and second orthogonal signals are orthogonal components of an input signal; and a non-linear device that receives the first and second predistorted signals and generates an output based upon the first and second predistorted signals, wherein the first error correction signal is determined based upon an analysis of the output and the first predistorted signal, and wherein the second error correction signal is determined based upon an analysis of the output and the second predistorted signal.

11. The system of claim 10, wherein the nonlinear device comprises one of (i) a power amplifier, (ii) a mixer, (iii) a frequency multiplier, and (iv) a transmitter.

12. The system of claim 10, wherein the first orthogonal signal includes an amplitude component of the input signal, and the second orthogonal signal includes a phase component of the input signal.

13. The system of claim 12, wherein the first error signal is an inverse amplitude error signal and the second error signal is an inverse phase error signal.

14. The system of claim 10, wherein the input signal is a Cartesian vector signal, and the first orthogonal signal includes an in-phase component of the Cartesian vector signal and the second orthogonal signal includes a Quadrature-phase component of the Cartesian vector signal.

15. The system of claim 10, wherein the first predistortion module is a multiplier that multiplies the first orthogonal signal with the first error signal, and wherein the second predistortion module is a phase adder that adds the second orthogonal signal with the second error signal.

16. The system of claim 10, wherein at least one of the first error signal and the second error signal includes even-order distortion terms.

17. The system of claim 10, wherein the first error correction signal is determined based upon a comparison of the first predistorted signal to the output that is processed by an envelope detector, and wherein the second error correction signal is determined based upon a comparison of the second predistorted signal to the output that is processed by an amplitude limiter.

18. The system of claim 17, wherein the first error correction signal is determined by dividing the first predistorted signal by the output that is processed by the envelope detector, and wherein the second error correction signal is determined by multiplying the second predistorted signal by the output that is processed by an amplitude limiter.

19. A system for multi-path orthogonal recursive predistortion, comprising:
means for generating a first orthogonal signal and a second orthogonal signal, wherein the first and second signals are orthogonal components of an input signal;
means for combining in analog the first orthogonal signal with a first error correction signal to generate a first predistorted signal;
means for combining in analog the second orthogonal signal with a second error correction signal to generate a second predistorted signal; and
a non-linear device that receives the first and second predistorted signals and generates an output based upon the first and second predistorted signals, wherein the first error correction signal is generated based upon an analysis of the output and the first predistorted signal, and wherein the second error correction signal is generated based upon an analysis of the output and the second predistorted signal.

20. The system of claim 19, wherein the first orthogonal signal includes an amplitude component of the input signal, and the second orthogonal signal includes a phase component of the input signal.

* * * * *